(12) United States Patent
Higuchi

(10) Patent No.: US 10,710,913 B2
(45) Date of Patent: Jul. 14, 2020

(54) WASTE LIQUID TREATMENT METHOD AND WASTE LIQUID TREATMENT APPARATUS

(71) Applicant: SCREEN Holdings Co., Ltd., Kyoto (JP)

(72) Inventor: Ayumi Higuchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 317 days.

(21) Appl. No.: 15/564,132

(22) PCT Filed: Apr. 7, 2016

(86) PCT No.: PCT/JP2016/061412
§ 371 (c)(1),
(2) Date: Oct. 3, 2017

(87) PCT Pub. No.: WO2016/167178
PCT Pub. Date: Oct. 20, 2016

(65) Prior Publication Data
US 2018/0079668 A1    Mar. 22, 2018

(30) Foreign Application Priority Data

Apr. 15, 2015  (JP) ................. 2015-083238

(51) Int. Cl.
*C02F 1/72* (2006.01)
*H01L 21/67* (2006.01)
(Continued)

(52) U.S. Cl.
CPC ............ *C02F 1/72* (2013.01); *H01L 21/6708* (2013.01); *C02F 1/52* (2013.01); *C02F 2101/10* (2013.01);
(Continued)

(58) Field of Classification Search
CPC ........................................ C02F 1/72
See application file for complete search history.

(56) References Cited

U.S. PATENT DOCUMENTS 6,306,282 B1   10/2001   Dungan et al.
6,485,629 B1   11/2002   Schowanek et al.
(Continued)

FOREIGN PATENT DOCUMENTS

CN    1668770 A    9/2005
CN    101312121 A    11/2008
(Continued)

OTHER PUBLICATIONS

Notification of Reason for Refusal dated Mar. 18, 2019 in counterpart Korean Patent Application No. 10-2017-7029235 with English translation obtained from Global Dossier.
(Continued)

*Primary Examiner* — Peter Keyworth
(74) *Attorney, Agent, or Firm* — Ostrolenk Faber LLP

(57) ABSTRACT

A substrate treatment unit applies surface treatment to a semiconductor substrate by using a chemical solution. The chemical solution in which metal is dissolved by substrate treatment is discharged into a storage tank and stored. A polyacid supplying unit supplies polyacid of a deletion complex with a deficient portion into the storage tank. The polyacid of deletion complex with a deficient portion is mixed into a used chemical solution containing the metal, and a pH value of the mixed solution is adjusted to between 2 and 3 to capture the metal dissolved in the chemical solution in the deficient portion of the polyacid. In addition, a counter cation is put into the chemical solution so that the polyacid in which the metal is captured is precipitated to be separated from the chemical solution, and thus the metal contained in the chemical solution during the treatment of
(Continued)

the semiconductor substrate can be removed to enable the chemical solution to be reclaimed.

2 Claims, 4 Drawing Sheets

(51) Int. Cl.
  *C02F 1/52* (2006.01)
  *C02F 101/10* (2006.01)
  *C02F 103/34* (2006.01)

(52) U.S. Cl.
  CPC .... *C02F 2103/346* (2013.01); *C02F 2303/18* (2013.01); *H01L 21/67017* (2013.01)

(56) References Cited

U.S. PATENT DOCUMENTS

| | | | |
|---|---|---|---|
| 7,722,841 | B2 | 5/2010 | Kawawa et al. |
| 2005/0159307 | A1 | 7/2005 | Okun et al. |
| 2006/0076297 | A1 | 4/2006 | Akahori et al. |
| 2006/0151399 | A1* | 7/2006 | Brandts ................ C02F 1/5236 210/723 |
| 2009/0114600 | A1 | 5/2009 | Brandts et al. |
| 2011/0278261 | A1 | 11/2011 | Himi et al. |

FOREIGN PATENT DOCUMENTS

| | | |
|---|---|---|
| CN | 102249449 A | 11/2011 |
| CN | 204058141 U | 12/2014 |
| CN | 104355444 A | 2/2015 |
| JP | 09-255991 | 9/1997 |
| JP | 2006-509616 | 3/2006 |
| JP | 2012-225892 | 11/2012 |
| JP | 2013-051305 | 3/2013 |
| JP | 2013-119665 | 6/2013 |
| KR | 10-2008-0103439 A | 11/2008 |
| KR | 10-2012-0002840 A | 1/2012 |
| TW | 201139624 | 11/2011 |
| WO | WO-2000/040512 | 7/2000 |
| WO | WO-2004/056712 | 7/2004 |
| WO | WO-2007/127587 | 11/2007 |

OTHER PUBLICATIONS

International Search Report in corresponding PCT/JP2016/061412.
Taiwanese Office Action, dated Jan. 11, 2017, with English language translation of search report.
Yavari, R. et al., "Synthesis, Ion Exchange Properties, and Applications of Amorphous Cerium (III) Tungstosilicate", Separation Science and Technology, Dec. 16, 2008 (received date), vol. 43, No. 15, pp. 3920-3935.
First Office Action and Search Report dated Dec. 31, 2019 in corresponding Chinese Patent Application No. 201680021628.7 with English translation obtained from JPO.
English translation of Search Report attached to First Office Action dated Dec. 31, 2019 in corresponding Chinese Patent Application No. 201680021628.7.

\* cited by examiner

F I G . 4
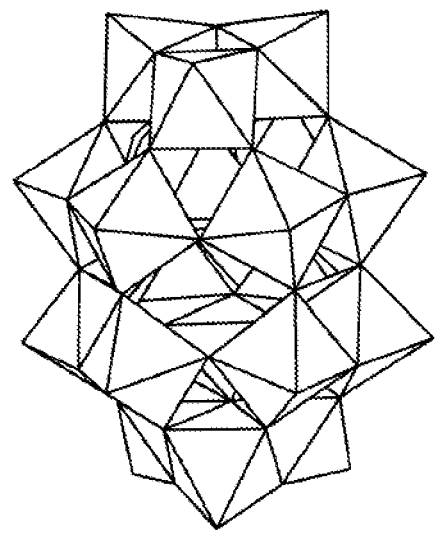

WASTE LIQUID TREATMENT METHOD AND WASTE LIQUID TREATMENT APPARATUS

CROSS-REFERENCE TO RELATED APPLICATIONS

The present application is a 35 U.S.C. §§ 371 national phase conversion of PCT/JP2016/061412, filed Apr. 7, 2016, which claims priority to Japanese Patent Application No. JP2015-083238, filed Apr. 15, 2015, the contents of which are incorporated herein by reference. The PCT International Application was published in the Japanese language.

TECHNICAL FIELD

The present invention relates to a waste liquid treatment method and a waste liquid treatment apparatus, for removing metal contained in a chemical solution, such as etchant, used in treatment of a semiconductor substrate, to reclaim the chemical solution.

BACKGROUND ART

In a back end process (BEOL: Back End Of the Line) of a semiconductor manufacturing process, an etching method is also used, so that various kinds of etchant are developed. Typically, etchant dissolves metal, so that etchant containing metal is disposed of as waste liquid.

Expensive etchant has been developed in many cases, so that it is desirable to reclaim such etchant by removing dissolved metal by using a method of some sort. For this reason, various techniques for removing and recovering metal dissolved in etchant have been conventionally studied, and Patent Document 1 provides a technique for capturing metal dissolved in etchant by using a carrier with a chelation group to reclaim the etchant, for example.

PRIOR ART DOCUMENTS

Patent Documents

Patent Document 1: Japanese Patent Application Laid-Open No. 2013-119665

SUMMARY OF INVENTION

Problems to be Solved by the Invention

Unfortunately, a conventionally developed method for reclaiming etchant has a problem of excessive cost or insufficient capacity of treatment, in many cases. For this reason, it is desirable to develop a technique for removing metal from a chemical solution, particularly expensive etchant, to reclaim the chemical solution.

The present invention is made in light of the above-mentioned problem, and an object thereof is to provide a waste liquid treatment method and a waste liquid treatment apparatus, capable of removing metal contained in a chemical solution to reclaim the chemical solution.

Means for Solving the Problems

To solve the problem described above, a first aspect of the invention is a waste liquid treatment method for removing metal contained in a chemical solution used in treatment of a semiconductor substrate, the method including the steps of: recovering the chemical solution used in treatment of a semiconductor substrate; and removing metal contained in the chemical solution recovered in the recovering step from the chemical solution by mixing polyacid in the chemical solution to allow the polyacid to capture the metal.

In the waste liquid treatment method according to the first aspect, a second aspect has the polyacid that is a deletion complex with a deficient portion.

In the waste liquid treatment method according to the second aspect, a third aspect allows the chemical solution recovered in the recovering step and the polyacid to react with each other at a pH value between 2 and 3 to capture metal contained in the chemical solution in the deficient portion of the polyacid.

In the waste liquid treatment method according to the third aspect, a fourth aspect further includes the step of precipitating a salt of the polyacid and a counter cation, acquired by putting the counter cation into a mixed solution of the polyacid having captured metal and the chemical solution.

In the waste liquid treatment method according to the fourth aspect, a fifth aspect further includes the step of reusing the chemical solution acquired by removing a precipitation formed in the precipitating step from the mixed solution, in treatment of a semiconductor substrate.

A sixth aspect is a waste liquid treatment apparatus for removing metal contained in a chemical solution used in treatment of a semiconductor substrate, the apparatus including: a substrate treatment unit for supplying a chemical solution to a semiconductor substrate to perform substrate treatment: a storage unit for recovering and storing an used chemical solution discharged from the substrate treatment unit; and a polyacid supplying unit for supplying polyacid to the storage unit in which the chemical solution is stored.

In the waste liquid treatment apparatus according to the sixth aspect, a seventh aspect has the polyacid that is a deletion complex with a deficient portion.

In the waste liquid treatment apparatus according to the seventh aspect, an eighth aspect further includes a pH-adjustment unit for adjusting a pH value of a mixed solution of the chemical solution stored in the storage unit and the polyacid to between 2 and 3.

In the waste liquid treatment apparatus according to the eighth aspect, a ninth aspect further includes a cation putting-into unit for putting a counter cation into the mixed solution of the chemical solution stored in the storage unit and the polyacid.

In the waste liquid treatment apparatus according to the ninth aspect, a tenth aspect further includes a reflux unit for refluxing a chemical solution acquired by removing a precipitation formed by inputting the counter cation from the mixed solution, to the substrate treatment unit.

Effects of the Invention

According to the waste liquid treatment method according to each of the first to fifth aspects, when polyacid is mixed into a chemical solution used in treatment of a semiconductor substrate to allow the polyacid to capture metal contained in the chemical solution, the metal is removed from the chemical solution to enable the chemical solution to be reclaimed.

According to the waste liquid treatment apparatus according to each of the sixth to tenth aspects, polyacid is supplied to an used chemical solution discharged from the substrate treatment unit that performs substrate treatment by supplying a chemical solution to a semiconductor substrate, so that metal contained in the chemical solution is captured in the polyacid to remove the metal from the chemical solution, thereby enabling the chemical solution to be reclaimed.

BRIEF DESCRIPTION OF DRAWINGS

FIG. 4 illustrates a structure of typical polyacid.

DESCRIPTION OF EMBODIMENT

Figure 1:
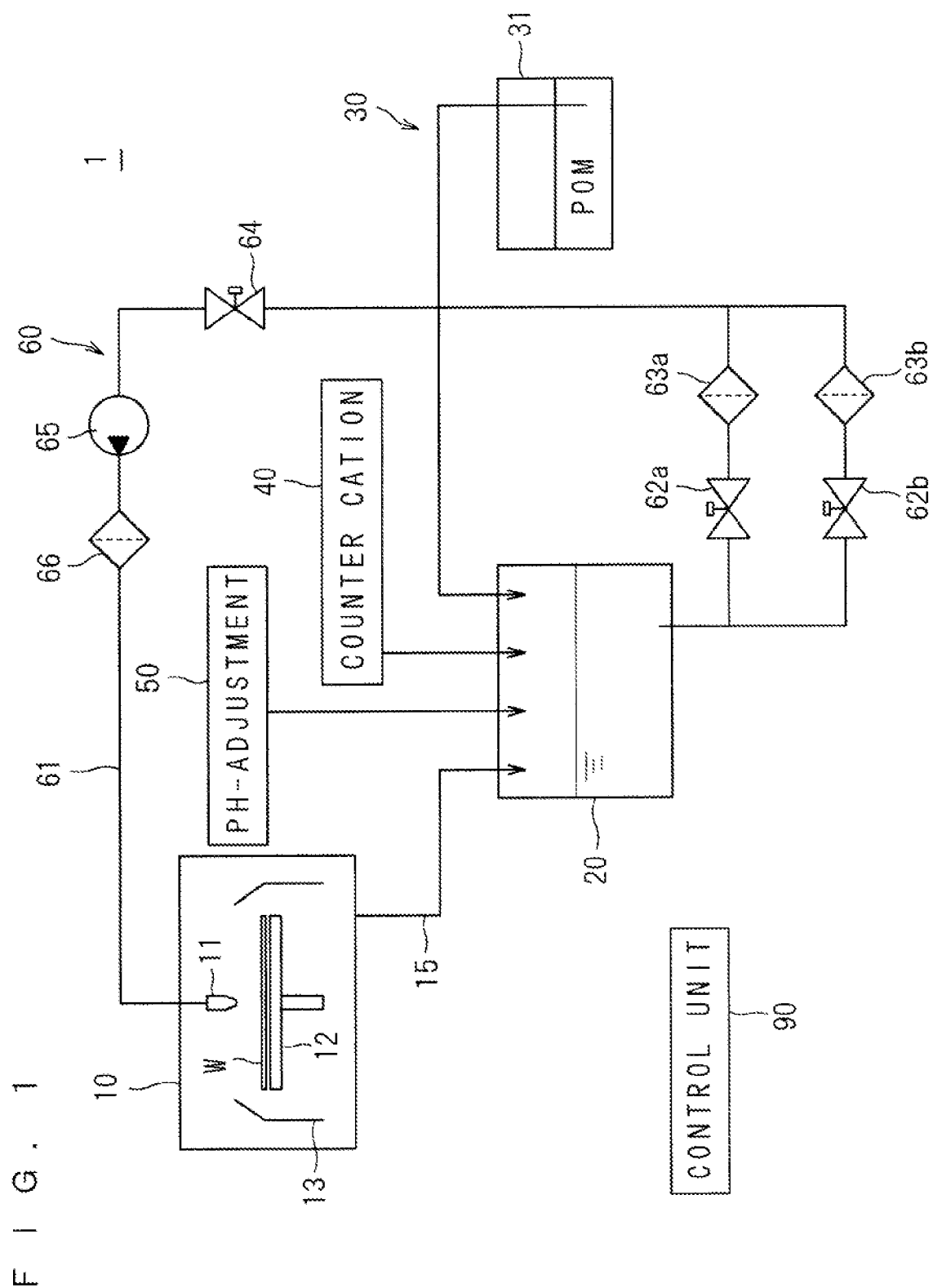
FIG. 1 illustrates a general schematic structure of a waste liquid treatment apparatus according to the present invention.

An embodiment of the present invention will be described in detail with reference to the accompanying drawings.
FIG. 1 illustrates a general schematic structure of a waste liquid treatment apparatus according to the present invention. A waste liquid treatment apparatus 1 removes metal contained in a chemical solution used in treatment of a semiconductor substrate W to reclaim and reuse the chemical solution. The waste liquid treatment apparatus 1 includes a substrate treatment unit 10 that applies chemical solution treatment to the a semiconductor substrate W, a storage tank 20 that recovers and stores a chemical solution discharged from the substrate treatment unit 10, a polyacid supplying unit 30 that supplies polyacid into the storage tank 20, and a reflux system 60 that refluxes the chemical solution from which metal is removed to be reclaimed, to the substrate treatment unit 10, as principal units. In addition, the waste liquid treatment apparatus 1 includes a cation putting-into unit 40 that puts a counter cation into the storage tank 20, and a pH-adjustment unit 50 that adjusts a pH value of a solution in the storage tank 20. Further, the waste liquid treatment apparatus 1 includes a control unit 90 that controls each mechanical unit of the apparatus to manage the entire apparatus.

The control unit 90 includes a CPU that is a circuit for performing various kinds of arithmetic processing, a ROM that is a read-only memory for storing a basic program, a RAM that is a rewritable memory for storing various kinds of information, and a magnetic disk that stores software for control, data, and the like. When the CPU of the control unit 90 executes a predetermined treatment program, each mechanical unit provided in the waste liquid treatment apparatus 1 is controlled to make treatment of a semiconductor substrate W and waste liquid treatment progress.

The substrate treatment unit 10 is a device of single wafer processing, configured to supply a chemical solution to a semiconductor substrate W to perform predetermined surface treatment, and includes a discharge nozzle 11, a spin chuck 12, a cup 13, and the like. In the present embodiment, as the chemical solution, a chemical solution formed by adding a buffering agent and an antiseptic agent into an aqueous solution of HF or $NH_4F$ base is used for an etchant, for example, and the substrate treatment unit 10 applies etching treatment to a surface of a semiconductor substrate W. The substrate treatment unit 10 allows the discharge nozzle 11 to discharge the chemical solution to a surface of a semiconductor substrate W held in the spin chuck 12 to make the etching treatment progress. The etching treatment may be performed while a semiconductor substrate W is rotated by the spin chuck 12, as needed. In this case, the cup 13 receives and recovers a chemical solution scattered from a rotating semiconductor substrate W.

The chemical solution used in the surface treatment of a semiconductor substrate W in the substrate treatment unit 10 is recovered to the storage tank 20 through a waste liquid line 15. The storage tank 20 stores a used chemical solution. The used chemical solution contains a metal component (ion) dissolved by the etching treatment in the substrate treatment unit 10. A kind of metal contained in the used chemical solution depends on a kind of thin film deposited on a semiconductor substrate W being a subject of the etching treatment in the substrate treatment unit 10, and titanium (Ti), copper (Cu), or the like is dissolved, for example.

The polyacid supplying unit 30 supplies polyacid into the storage tank 20. The polyacid is anionic species formed by condensing oxo acid. The oxo acid is a compound in which a hydroxyl group (—OH) and an oxo group (=O) bind with an atom, the hydroxyl group providing an acidic proton. For example, oxo acid of carbon (C) is carbonic acid, oxo acid of sulfur (S) is sulfuric acid, and particularly oxo acid of transition metal is called metal oxo acid. The polyacid is formed by condensing metal oxo acid containing metal, and thus can be deemed as molecular ion species of a metallic oxide, then is also called polyoxometalate (POM).

Figure 2:
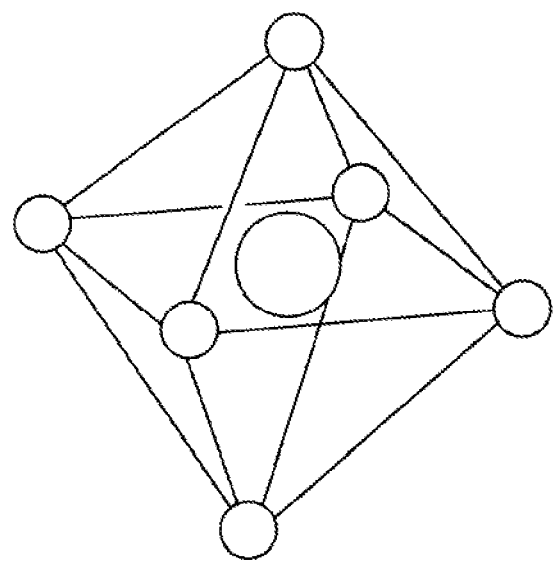
FIG. 2 illustrates an example of a basic structure of polyacid.

A base unit constituting polyacid is a polyhedron, such as a tetrahedron, a quadrangular pyramid, and an octahedron, formed while four to six oxide ions ($O^{2-}$) are coordinated with a transition metal ion. FIG. 2 illustrates an example of a basic structure of polyacid. FIG. 2 illustrates an $MO_6$ octahedron that is a typical base structure of polyacid. In a case of the $MO_6$ octahedron, a transition metal ion exists at a position of the center of gravity of a regular octahedron. An ion of the transition metal (M) positioned at the center of gravity of the $MO_6$ octahedron is typically molybdenum ($Mo^{6+}$), vanadium ($V^{5+}$), tungsten ($W^{6+}$), niobium ($Nb^{5+}$), tantalum ($Ta^{5+}$), or the like. The $MO_6$ octahedron is formed while six oxide ions are coordinated at positions of respective vertexes of the regular octahedron so as to close around the transition metal ion.

Figure 3:
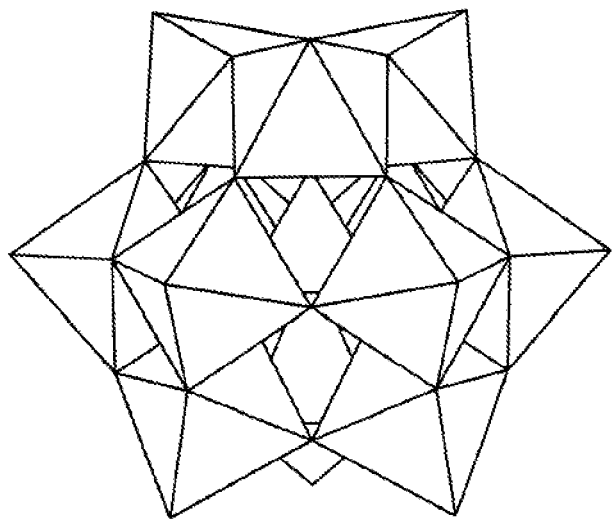
FIG. 3 illustrates a structure of typical polyacid.

Polyacid is a polynuclear complex that is formed while a large number of polyhedrons as described above are condensed by sharing ridges and vertexes. FIGS. 3 and 4 each illustrate a structure of typical polyacid. FIG. 3 illustrates a Keggin type structure expressed by $[XM_{12}O_{40}]^{n-}$. FIG. 4 illustrates a Dawson type structure expressed by $[X_2M_{18}O_{62}]^{n-}$. In each of the structures, a large number of $MO_6$ octahedrons are coordinated around metal (X) to be one nucleus in the Keggin type structure, and to be two nucleuses in the Dawson type structure. The metal (X) to be a nucleus is silicon (Si), phosphorus (P), sulfur (S), or the like, for example.

The polyacid with a structure such as described above has characteristics of not only low metal corrosiveness but also redox properties while yet being strong acid equivalent to sulfuric acid and hydrochloric acid. While the polyacid has high solubility for water and a polar solvent, a structure of the polyacid is maintained even in a solution. In addition, the polyacid has an important characteristic of allowing the polyacid to stably exist in a solution as a deletion complex in which one or two polyhedrons each being a base unit are deficient. For example, even in a structure in which one or two $MO_6$ octahedrons are deficient from the polyacid with the structure illustrated in each of FIGS. 3 and 4, the polyacid can stably exist in a solution with a pH value between 2 and 7. Then, the deletion complex of the polyacid can capture oxo acid of dissimilar metal (metal different in kind from metals X and M constituting the polyacid) in its deficient portion. In other words, some of the metal M constituting the polyacid can be replaced with dissimilar metal. The present invention is completed with a focus on the characteristics of poly acid.

Returning to FIG. 1, the polyacid supplying unit 30 supplies polyacid of a deletion complex with a deficient portion into the storage tank 20. The polyacid supplying unit 30 includes a polyacid tank 31, and a supply pump, a valve, and the like, which are not illustrated. The polyacid tank 31 stores a solution of polyacid of deletion complex that is preliminarily prepared. The solution has a pH value between 2 and 7 at which polyacid of deletion complex can stably exist. The polyacid supplying unit 30 supplies the solution of polyacid of deletion complex into the storage tank 20 in which a used chemical solution is stored.

When the polyacid is supplied from the polyacid supplying unit 30, a mixed solution of the used chemical solution and the polyacid of deletion complex exist in the storage tank 20. The pH-adjustment unit 50 adjusts a pH value of the mixed solution to between 2 and 3. Specifically, the pH-adjustment unit 50 puts a pH-adjustment agent (e.g., an acid solution) into the storage tank 20 to adjust a pH value of the mixed solution to between 2 and 3. When the mixed solution, stored in the storage tank 20, of the used chemical solution and the polyacid of deletion complex has a pH value between 2 and 3, a reaction of allowing a metal ion contained in the chemical solution to be captured in a deficient portion of the polyacid as oxo acid progresses. As a result, metal is removed from the used chemical solution discharged from the substrate treatment unit 10.

However, a solution of polyacid is strong acid, and thus when a chemical solution used in the substrate treatment unit 10 is also acidity, a pH value of a mixed solution itself of the used chemical solution and the polyacid may be within a range between 2 and 3 without particularly performing a pH-value adjustment. In such a case, the pH-adjustment unit 50 does not perform a pH-adjustment in the storage tank 20. When a mixed solution of a used chemical solution and polyacid has a pH value between 2 and 3 without performing a pH-adjustment, a reaction of allowing a metal ion contained in the chemical solution to be captured in a deficient portion of the polyacid as oxo acid progresses.

When metal dissolved in a chemical solution by treatment of a semiconductor substrate W in the substrate treatment unit 10 is captured by polyacid, a mixed solution of the polyacid in which the metal is captured and the chemical solution from which the metal is removed is stored in the storage tank 20. The cation putting-into unit 40 puts a counter cation of polyacid, being anionic species, into the mixed solution. As the counter cation, n-Bu$_4$NBr is available, for example. When the cation putting-into unit 40 puts the counter cation into the storage tank 20, the polyacid in which metal is captured and the counter cation react with each other to be precipitated as a salt. When the precipitation is formed in the mixed solution, the polyacid in which metal is captured can be separated from the mixed solution of the chemical solution and the polyacid.

After the precipitation is formed by putting the counter cation into the mixed solution in the storage tank 20, the reflux system 60 removes the precipitation from the mixed solution to reclaim the chemical solution, and then the chemical solution is refluxed to the substrate treatment unit 10 again to be reused. The reflux system 60 includes a reflux pipe 61, removing valves 62a and 62b, removing filters 63a and 63b, a main valve 64, a reflux pump 65, and a main filter 66. The reflux pipe 61 is connected at its base end to the storage tank 20, and is connected at its leading end to the discharge nozzle 11. The reflux pipe 61 branches into two pipes in the middle of a channel, and one of the two pipes is provided with the removing valve 62a and the removing filter 63a, and the other thereof is provided with the removing valve 62b and the removing filter 63b. Each of other components of the main valve 64, the reflux pump 65, and the main filter 66 is provided in a channel into which the reflux pipe 61 having branched into the two pipes is merged again.

The removing filter 63a and the removing filter 63b are alternatively used. That is, any one of the removing valve 62a and the removing valve 62b is selectively opened. In a state where the reflux pump 65 operates while the main valve 64 is opened, opening the removing valve 62a while the removing valve 62b is closed causes a mixed solution containing a precipitation in the storage tank 20 to pass through the removing filter 63a. At this time, the removing filter 63a removes the precipitation containing polyacid in which metal is captured from the mixed solution. Meanwhile, in a state where the reflux pump 65 operates while the main valve 64 is opened, opening the removing valve 62b while the removing valve 62a is closed causes the mixed solution containing the precipitation in the storage tank 20 to pass through the removing filter 63b. At this time, the removing filter 63b removes the precipitation containing polyacid in which metal is captured from the mixed solution.

The removing filters 63a and 63b each are a filtration filter for filtering a precipitation from liquid containing the precipitation, and thus are clogged in a relatively short time. Thus, the removing filter 63a and the removing filter 63b are configured to be alternatively used. The removing filter 63b is replaced while the removing filter 63a is used, and the removing filter 63a is replaced while the removing filter 63b is used, so that a blockage of piping caused by clogging of the filters can be prevented. Alternatively, a precipitation collected in used removing filters 63a and 63b may be recovered to separate metal from the precipitation by using an oxidation-reduction reaction, thereby reclaiming and reusing polyacid.

When a mixed solution passes through the removing filter 63a or the removing filter 63b, a precipitation containing polyacid in which metal is captured is removed from the mixed solution, and then a chemical solution is to be reclaimed. The reclaimed chemical solution is fed to the discharge nozzle 11 of the substrate treatment unit 10 by the reflux pump 65, and then is reused by being discharged from the discharge nozzle 11 to a semiconductor substrate W.

In the present embodiment, polyacid of deletion complex with a deficient portion is mixed into a used chemical solution containing metal, and a pH value of the mixed solution is adjusted to between 2 and 3 to capture metal dissolved in the chemical solution in the deficient portion of the polyacid. This enables metal contained in a chemical solution during treatment of a semiconductor substrate W to be removed, so that the chemical solution can be reclaimed. A chemical solution used in the substrate treatment unit 10 may be expensive, and thus if metal can be removed from a used chemical solution to reclaim the chemical solution, the chemical solution can be repeatedly reused, whereby increase in treatment cost can be suppressed.

While the embodiment of the present invention is described as above, various modifications other than the embodiment described above are possible within a range without departing from the spirit of the present invention. For example, a chemical solution used in the substrate treatment unit 10 is etchant in the embodiment described above, but is not limited to the etchant, and thus another kind of chemical solution, such as a polymer removing liquid, may be available. As a more expensive chemical solution is used, an effect of reclaiming and reusing the chemical solution increases.

The substrate treatment unit 10 is not limited to a device of single wafer processing in which a semiconductor substrate W is treated one by one, and thus may be a batch-type processing unit in which a plurality of semiconductor substrates W is immersed in a chemical solution stored in a treatment tank to collectively perform surface treatment. Even if the substrate treatment unit 10 is a batch-type processing unit, reclaiming a chemical solution discharged from a treatment tank, as with the embodiment described above, enables a similar effect to be acquired.

While polyacid and a counter cation are directly put into the storage tank 20, into which a used chemical solution is recovered, to form a precipitation in the embodiment described above, a dedicated precipitation tank for forming a precipitation, and separating and collecting the precipitation, may be provided along with the storage tank 20.

While titanium and copper are contained in a chemical solution discharged from the substrate treatment unit 10 in the embodiment described above, metal to be remove in the present invention may be tungsten (W), tantalum (Ta), ruthenium (Ru), cobalt (Co), or the like, besides the above.

Instead of putting into a counter cation, an ion exchange filter may be used for each of the removing filters 63a and 63b, so that polyacid in which metal is captured is deposited on the removing filters 63a and 63b to separate the polyacid from a chemical solution.

The present invention is suitable for a technique for removing metal dissolved in a chemical solution during surface treatment of a semiconductor substrate to reclaim and reuse the chemical solution.

REFERENCE SIGNS LIST

1: waste liquid treatment apparatus
10: substrate treatment unit
20: storage tank
30: polyacid supplying unit
40: cation putting-into unit
50: pH-adjustment unit
60: reflux system
63a, 63b: removing filter
90: control unit
W: semiconductor substrate

The invention claimed is:

1. A waste liquid treatment method for removing metal contained in a chemical solution used in treatment of a semiconductor substrate, the method comprising the steps of:
   (a) recovering the chemical solution used in treatment of a semiconductor substrate;
   (b) removing metal contained in the chemical solution recovered in said step (a) from the chemical solution by mixing polyacid in the chemical solution to allow the polyacid to capture the metal; and
   c) precipitating a salt of the polyacid and a counter cation, acquired by putting the counter cation into a mixed solution of the polyacid having captured metal and said chemical solution, wherein
   said polyacid is a deletion complex with a deficient portion, and
   the chemical solution recovered in said step (a) and the polyacid are allowed to react with each other at a pH value between 2 and 3 to capture metal contained in the chemical solution in the deficient portion of the polyacid.

2. The waste liquid treatment method according to claim 1, further comprising the step of:
   (d) reusing the chemical solution acquired by removing a precipitation formed in said step (c) from said mixed solution, in treatment of a semiconductor substrate.

* * * * *